US005626784A

United States Patent [19]

Simons

[11] Patent Number: 5,626,784
[45] Date of Patent: May 6, 1997

[54] IN-SITU SIZING OF PHOTOLITHOGRAPHIC MASK OR THE LIKE, AND FRAME THEREFORE

[75] Inventor: Everett F. Simons, Palatine, Ill.

[73] Assignee: Motorola, Inc., Schaumburg, Ill.

[21] Appl. No.: 414,898

[22] Filed: Mar. 31, 1995

[51] Int. Cl.$^6$ ................................................ H05B 3/06
[52] U.S. Cl. ........................ 219/521; 219/200; 33/614; 101/481; 430/22; 430/5
[58] Field of Search ...................... 219/521, 221, 219/243, 85.1, 85.12, 85.13, 200–201; 430/5, 22; 437/924; 33/614–615; 101/467, 470, 481, DIG. 36

[56] References Cited

U.S. PATENT DOCUMENTS

| | | | |
|---|---|---|---|
| 3,617,126 | 11/1971 | Gillespie | 355/72 |
| 3,800,697 | 4/1974 | Sullivan | 219/201 |
| 3,927,943 | 12/1975 | Pohl et al. | 355/132 |
| 4,457,114 | 7/1984 | Hennenfent et al. | 219/200 |
| 4,805,316 | 2/1989 | Curti | 33/614 |
| 4,907,505 | 3/1990 | Ericsson et al. | 101/DIG. 36 |
| 5,063,842 | 11/1991 | Clarke | 101/127.1 |
| 5,129,155 | 7/1992 | Hoffman et al. | 33/614 |
| 5,226,366 | 7/1993 | Schlife et al. | 101/DIG. 36 |

OTHER PUBLICATIONS

Tamarack scientific co., inc., "Mask Alignment & Exposure System" advertising brochure undated.
C.A. Picard Inc., "Accuracy made easy" advertising brochure undated.

*Primary Examiner*—Teresa J. Walberg
*Assistant Examiner*—Raphael Valencia
*Attorney, Agent, or Firm*—Douglas D. Fekete

[57] ABSTRACT

Alignment of a mask, such as a photolithographic mask, to a workpiece, such as a printed circuit board is improved using a frame having sides that are individually thermally expandable. The mask is fabricated to be undersized so that the distance between fiducials on the mask is less than a desired distance, which may be the distance between corresponding fiducials on the workpiece. The mask is mounted on the frame, whereafter at least one side of the frame is heated to expand the side and stretch the mask to achieve the desired interfiducial distance.

4 Claims, 3 Drawing Sheets

IN-SITU SIZING OF PHOTOLITHOGRAPHIC MASK OR THE LIKE, AND FRAME THEREFORE

BACKGROUND OF THE INVENTION

This invention relates to a method for sizing a mask, such as a photolithographic mask, for alignment to a substrate. More particularly, this invention relates to such method wherein the mask is mounted in a frame comprising a side that is individually heated to stretch the mask and thereby achieve accurate dimensions therein.

In the manufacturer of microelectronic components, such as integrated circuit die or printed circuit boards, it is common practice to utilize a mask to limit processing to selected regions. By way of a common example, a photolithographic mask is employed to selectively expose and develop a photoresist layer. The photolithographic mask is formed of a thin polymeric film and is affixed to a glass plate. Precise alignment of the mask and the workpiece is required, particularly in forming fine features having dimensions of a hundred microns or less. For this purpose, the mask typically comprises fiducials and is aligned so that the fiducials in the mask register with fiducials on the workpiece. In order to obtain precise registration, the dimensions between fiducials on the mask must precisely correspond to the dimensions between fiducials on the workpiece. Difficulty is experienced in forming the mask with such precise dimensions. Moreover, even though formed with precise dimensions, the polymeric film is susceptible to variations in the ambient conditions, including particularly temperature and humidity. Because of a microscopic precision, variations of one or two degrees Centigrade or three or less percent relative humidity are sufficient to significantly effect the dimensions of the mask. Still further, in processing a series of substrates, variations occur in the features between individual substrates, which requires compensation in order to achieve precise location of features subsequently formed on the workpiece. Therefore, there is a need for precisely adjusting the dimension of a mask after the mask is formed and while at the workstation to bring the dimensions of the mask into congruence with the substrate.

DESCRIPTION OF THE DRAWINGS

This invention will be further illustrated with reference to the drawings wherein.

DETAILED DESCRIPTION OF A PREFERRED EMBODIMENT

Figure 1:
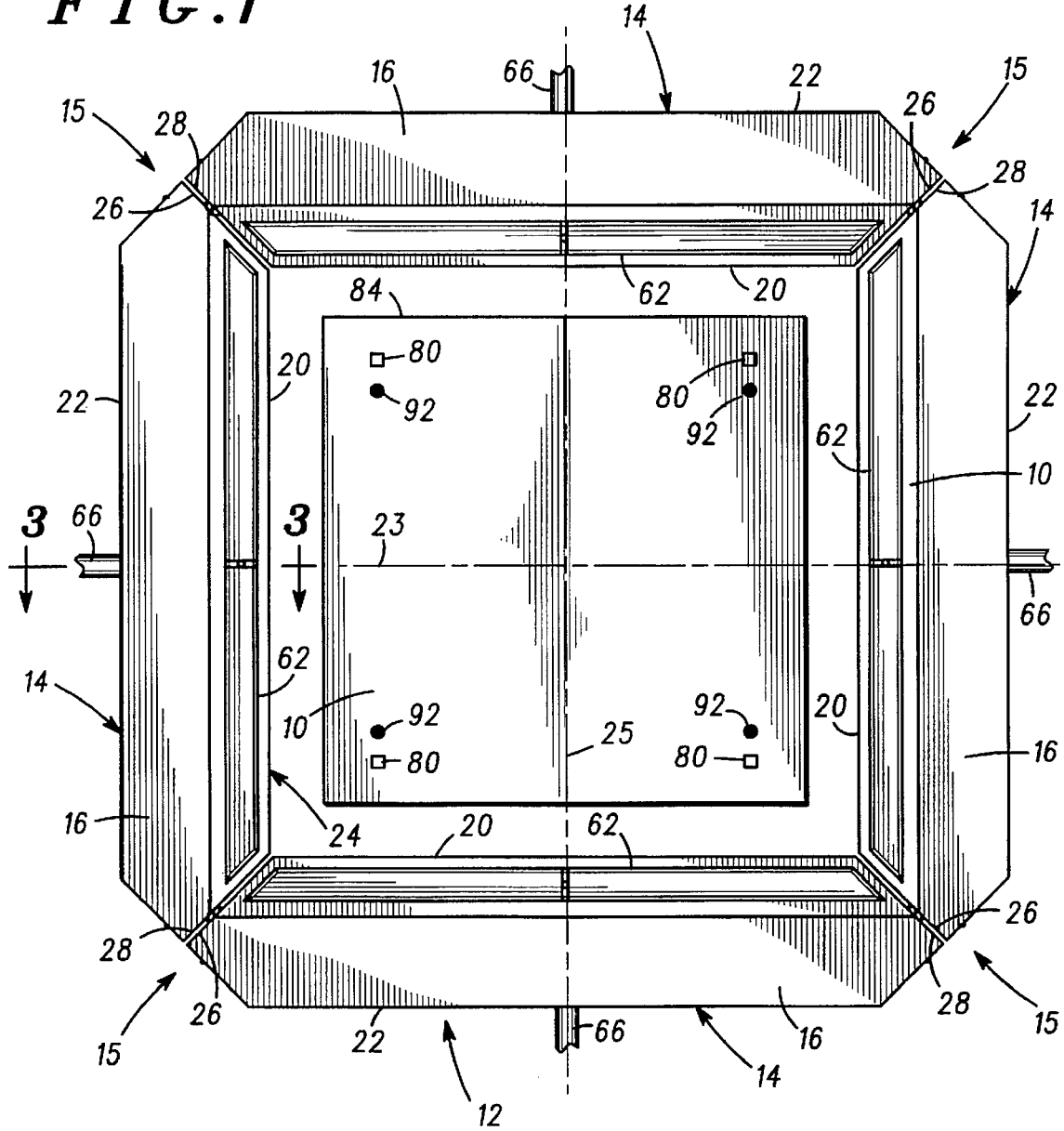
FIG. 1 is a top plan view of a dimensional adjustable frame in accordance with this invention.

Referring to FIGS. 1–4, in accordance with a preferred embodiment of this invention, a photolithographic mask 10 is mounted in a frame 12 that comprises four individually thermally expandable sides 14 that intersect at corners 15. Sides 14 are formed preferably of aluminum-base metal and comprise a planar top surface 16, a bottom surface 18, a linear inner edge 20, and an outer edge 22. Sides 14 are arranged such that the top surfaces 16 are coplanar and further such that inner edges 20 define an opening 24 that is substantially rectangular. In this embodiment, sides 14 are substantially equal in length so that opening 24 is a square having two, opposite sides parallel to x-axis 23 and the remaining two, opposite sides parallel to y-axis 25 that is perpendicular to x-axis 23. Mask 10 is attached to top surfaces 16 and covers opening 24. It is a significant feature of this invention that each side 14 is thermally expandable in a direction parallel to the inner edge 20 to stretch mask 10 to achieve precise dimensions.

Each side 14 comprises opposite ends 26 and 28 that intersect inner edge 20 at an angle of about 135°, so that the edges extend diagonally at an angle of about 45° at the corners of rectangular opening 24. At each corner 15, an end 26 of a side 14 is juxtaposed to an end 28 of an adjacent side, but is spaced apart therefrom to provide a thermal barrier between the sides.

Figure 4:
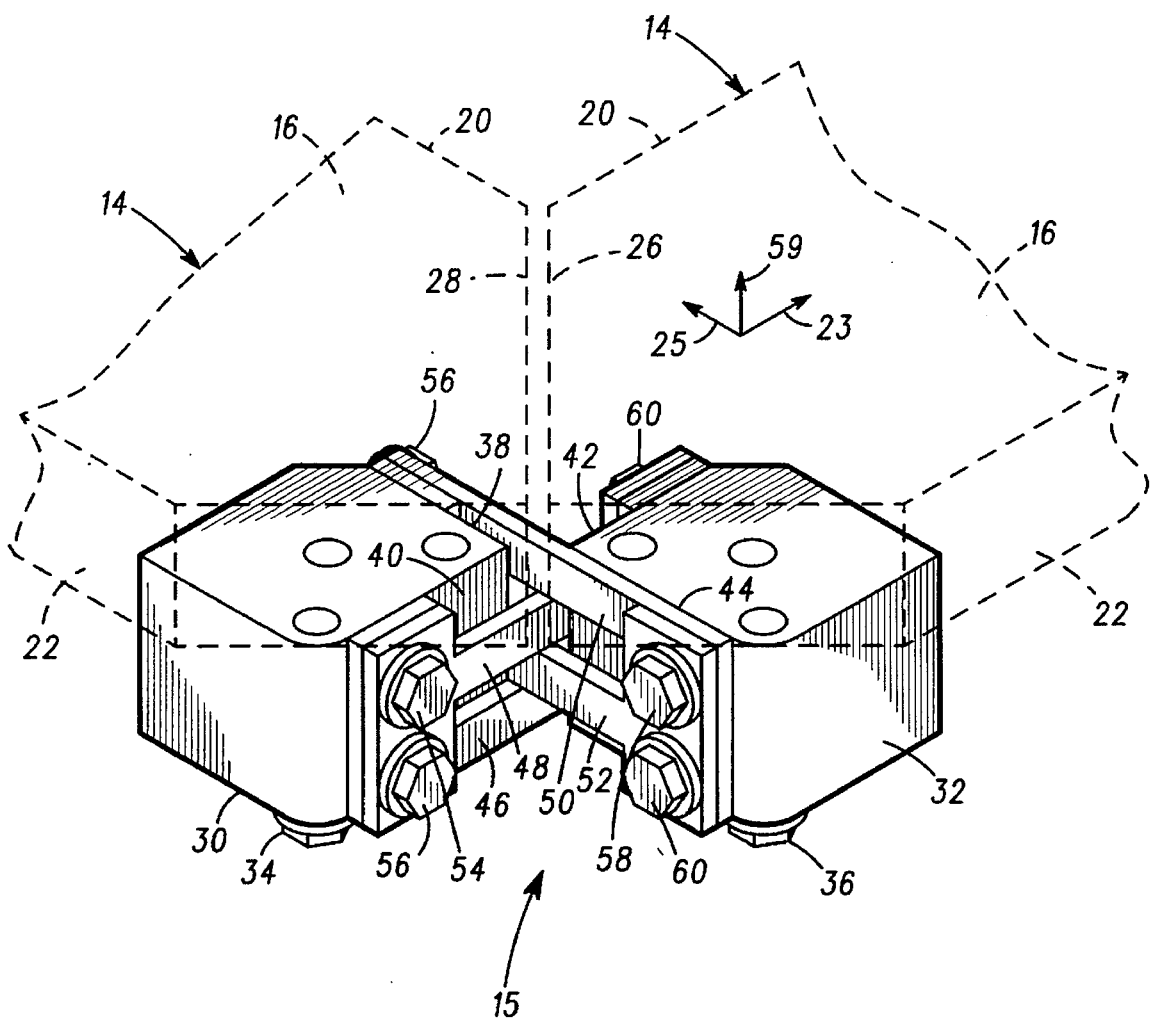
FIG. 4 is a perspective view of a corner detail of the frame in FIG. 1.

Sides 14 are connected at corners 15 by a connecting structure that comprises a block 30 affixed by bolts 34 to the bottom surface of one side and a block 32 affixed by bolts 36 to the bottom surfaces of the adjacent side, the details of which as shown in FIG. 4. Block 30 comprises faces 38 and 40 that are perpendicular to bottom surface 18. Face 38 lies parallel to edge 20 of the side to which block 30 is mounted, whereas face 40 is perpendicular to the edge 20. Similarly, block 32 comprises faces 42 and 44 that are perpendicular to bottom surface 18 and are disposed so that face 42 is parallel edge 20 of the side to which it is mounted and face 44 is perpendicular to the edge 20. Blocks 30 and 32 are connected through tie bars 46, 48, 50 and 52 that are arranged in interdigitated pairs. The tie bars include integral end plates that are bolted to the faces of blocks 30 and 32 by bolts 54, 56, 58 and 60. With reference to a particular side 14, one pair of tie bars extends parallel to the inner edge 20, and the other pair of tie bars extend perpendicular to the inner 20. The tie bars cooperate to form a connection that is rigid relative to a z-axis 59 perpendicular to axiis 23 and 25, i.e., to the plane of top surfaces 16. Z-axis rigidity is attributed to the arrangement of the tie bars in spaced pairs and to the cumulative z-axial width of the tie bars, and prevents displacement of the sides along z-axis 59 to thereby maintain the top surfaces 16 in the desired coplanar arrangement. However, the tie bars are sufficiently thin to permit flexure along axiis 23 and 25 to accommodate thermal expansion of the side 18. The mass of blocks 30 and 32 and the limited cross-sectional areas of tie bars 46, 48, 50 and 52 cooperate to inhibit thermal conduction between the adjacent sides and thereby permit the sides to be individually heated.

Figure 3:
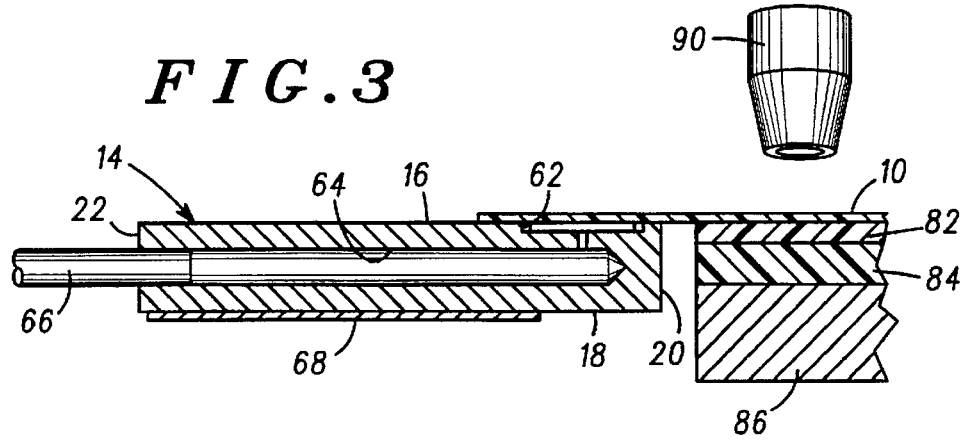
FIG. 3 is a cross-sectional view of the frame in FIG. 1 taken along line 3—3 in the direction of the arrows.
Figure 2:
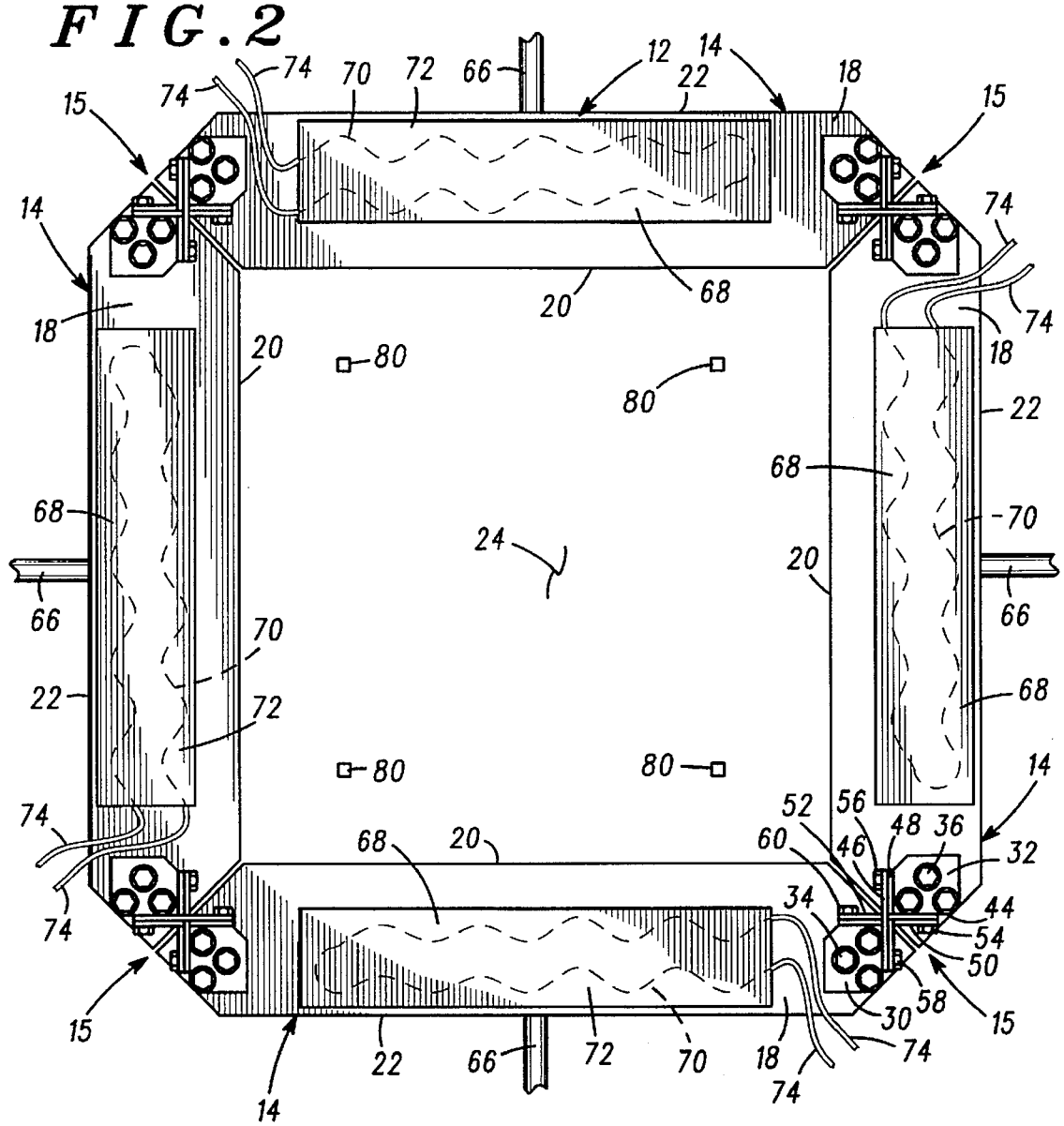
FIG. 2 is a bottom plan view of the frame in FIG. 1.

Referring particularly to FIGS. 1 and 3, the top surface 16 of each side 14 includes a continuous trapezoidal groove 62 proximate to inner edge 20. Each groove 62 is connected to a bore 64 that extends from the outer edges 22 and is coupled to a vacuum line 66. Mask 10 is sized to overlap grooves 62. Thus, during use, a vacuum applied through vacuum lines 66 holds the perimeter of mask 10 securely against top surfaces 16, and thereby holds mask 10 onto frame 12.

Each side 18 also includes means for selectively heating the side to thermally expand the side, which means is provided in this embodiment by a heating element 68. Each heating element 68 comprises an electrically resistive, serpentine heating wire 70 embedded in a thermally conductive matrix 72 adhesively bonded to the bottom surface 18. The resistive heating wires includes leads 74 that are adapted for connection to a remote electrical power source. During use, electrical current conducted through a wire 70 heats element 68 to thereby heat side 18 to which the element is attached, thereby expanding the side in the direction parallel to the inner edge 20.

By way of a preferred example, frame 12 is employed to mount a mask 10 for use in a photolithographic process. For this purpose, mask 10 is arranged onto the frame 12 such that the mask extends over opening 24 and further so that the perimeter of mask 10 overlaps top surfaces 16 by an amount sufficient to cover grooves 62. Vacuum is applied through vacuum lines 66 to hold the mask in position. As is common practice in the microelectronic industry, mask 10 features a detailed pattern composed of transparent, i.e. clear, regions and opaque, i.e. dark, regions, the details of which, except for fiducials 80, have been omitted from the drawings in order to better illustrate the present invention. Mask 10 is employed to selectively expose a photoresist layer 82 applied to a workpiece 84 that is set upon a table 86, as shown in FIG. 3. It is an advantage of this invention that the mask and workpiece are suitably mounted into conventional photolithographic equipment of the type having a video inspection system for detecting the position of the workpiece relative to the mask, and further having a mechanism for accurately adjusting table 86, particularly along the directions of the x-axis 23 and y-axis 25, while maintaining the frame stationary. Workpiece 84 is arranged within opening 24 of frame 14, with mask 10 superposed over photoresist layer 82, but spaced apart therefrom to allow independent positioning of the workpiece relative to the mask. The position of frame 12, and thus mask 10, is fixed, whereas the position of table 86 is adjustable to precisely position workpiece 84 relative to mask 10. A camera 90 is employed for viewing mask 10, as well as workpiece 84 through clear regions of the mask, and provides a magnified video display to facilitate precise positioning of the mask 10 and workpiece 84.

Figure 6:
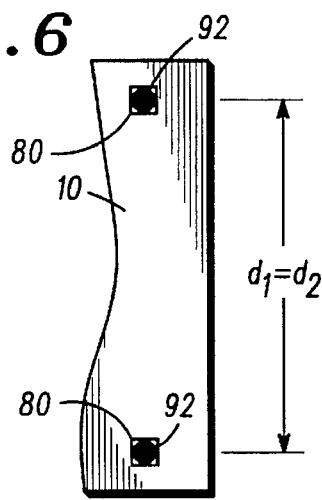
FIG. 6 is a plan view of a mask and workpiece, similar to FIG. 5, but following dimensional adjustment in accordance with this invention to create fiducial registration.
Figure 5:
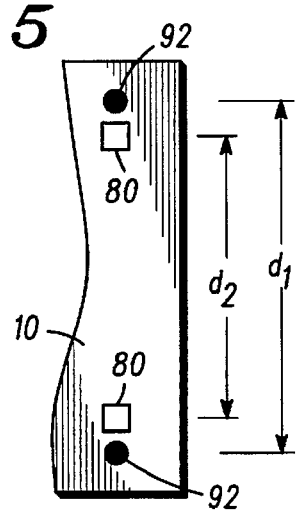
FIG. 5 is a plan view of a partial view of a portion of a mask and workpiece showing fiducials thereof prior to dimensional adjustment in accordance with this invention.

Referring to FIG. 5 in this embodiment, workpiece 84 includes first and second fiducials 92, depicted as solid circles, which are separated by a predetermined distance $d_1$. Mask 10 includes third and fourth fiducials 80, depicted as squares having transparent interiors, spaced apart about the mask. As used herein, fiducial refers to any marking or feature of the mask or workpiece that is used as a reference in determining the dimensions or aligning the mask. Fiducials 92 are visible to camera 90 through transparent regions in mask 10. Mask 10 is manufactured by conventional photolithographic techniques except that the pattern is intentional undersized. It is a significant feature of this invention that mask 10 is intentionally fabricated to be undersized so that the distance $d_2$ between third and fourth fiducials 80 in FIG. 5 is less than the distance $d_1$ between first and second fiducials 92. In this example, the interfiducial distances are measured from the centerpoints of the fiducials. The undersized mask is then mounted in frame 12 and arranged with workpiece 84. Once arranged as shown in FIG. 5, electrical current is applied to the heating element attached to the side of the frame that is proximate to a pair of fiducials 80, and has the inner edge parallel to $d_1$. This electrical current heats the side, whereupon the metal expands, stretching mask 10 in the direction of $d_1$. The side is heated until mask 10 has been stretched so that $d_2$ equals $d_1$. The position of table 86 is then adjusted to align the first fiducial 92 on the workpiece with the corresponding third fiducial 80 of the mask, and the second fiducial 92 on the workpiece with the fourth fiducial 80 on the mask, as shown in FIG. 6. Following precise alignment, photoresist layer 82 is suitably exposed to a light through mask 10, and developed to produce the desired features on the workpiece.

By way of a specific example, the method of this invention is suitable for defining a photoresist layer on a workpiece that is a printed circuit board. In this example, the workpiece is provided with fiducials 92 that are spaced apart by distance $d_1$ of about 20 centimeters. Distance $d_1$ may vary between workpieces, but is predetermined for a particular workpiece. The mask is fabricated so that the distance $d_2$ between fiducials 80 is 19.995 centimeters, less than the anticipated value of the distance $d_1$. The sides 14 of frame 12 are initially at the ambient temperature of the work station, about 22° C. The aluminum side 14 proximate to the fiducials 80 in FIG. 5 is then heated to increase the temperature by about 10° C., whereupon the aluminum of the side expands by an amount sufficient to increase the distance $d_2$ by an amount of 50 microns, so that the distance $d_2$ between fiducials 80 is equal to $d_1$, the distance between fiducials 92. Fiducials 80 may then be readily aligned with fiducials 92, and the photoresist layer accurately processed.

Therefore, this invention provides a method for precisely adjusting the dimension of a mask in situ, that is, after the mask is mounted in the frame at the workstation and even after the frame is arranged with a workpiece. This is accomplished by fabricating a mask having dimensions between fiducials that is known to be less than the desired dimensions on the workpiece. The mask is suitably formed by conventional techniques for making photolithographic masks but is slightly undersized, typically by an amount on the order of about 50 microns, despite interfiducial dimensions of several centimeters. The mask is formed with the same precision as conventional masks, so that the interfiducial dimensions may be defined with great accuracy, but have a value less than the desired ultimate dimension for processing. The mask is then mounted in a frame having sides that are individually thermally expandable. In accordance with this invention, at least one side of the frame is then heated to thermally expand the side and to stretch the mask to the desired dimensions. Because of the small dimensional adjustment, typically 50 microns or less, this stretching is carried out within the elastic range of the mask material and is substantially uniformed along the mask. This thermal expansion is continued until a predetermined interfiducial distance is achieved in the mask. In the described embodiment, this predetermined distance is the distance between corresponding fiducials on the workpiece, whereafter the mask fiducials are brought to register with the corresponding fiducials on the workpiece. One advantage of this invention is that precise registration may be obtained despite variations in the interfiducial distances on the workpiece. That is, in processing a series of workpieces utilizing a single mask, the distance between fiducials on the workpieces may vary between workpieces, yet precise registration may be obtained by heating, or alternately cooling, the frame elements to adjust the dimensions of the mask to correspond to a particular workpiece. This permits greater accuracy in locating features on the workpiece following processing then would otherwise be obtained utilizing a mask with set dimensions that do not precisely register with the workpiece.

In the described embodiment, the frame comprises four sides disposed in a rectangular arrangement and defining a rectangular opening. It is a further advantage of this invention that each side may be individually heated to control the expansion and thereby selectively stretch the portion of the mask adjacent to the side. Thus, one side may be heated to a first temperature to stretch the adjacent region of the mask to adjust a distance between fiducials there, while an opposite is heated to a second, different temperature to adjust the adjacent mask by a second, different distance. Moreover, adjacent sides may be heated to adjust both the length and width of the mask. While this invention has been disclosed for a rectangular frame, the frame may include a greater number of sides in order to provide greater control of dimensional adjustments within different regions of the mask. For example, an octagonal frame may be employed to facilitate adjustments in directions that are diagonal to the sides of a rectangular frame. Moreover, sides may be formed of multiple elements that are individually heated to optimize adjustments in discrete regions of the mask. Still further, depending upon the nature of the workpiece, only some sides may require heating elements in order to permit adjustment in desired directions.

While in the described embodiment, this invention is disclosed for adjusting dimensions within a photolithographic mask formed of a polymeric material, it may be adapted for adjusting dimension within other types of masks formed of other types of material that may be elastically stretched. For example, a frame having individually thermally expandable sides in accordance with this invention may be employed to adjust dimensions of a metal mask of the type having openings for depositing material onto selective regions of a substrate, such as by vapor deposition or printing. This is in part attributed to the relatively small adjustments contemplated in the practice of this invention, typically on the order of 50 microns, which is tolerable by metal masks even despite a relative high tensile modulus.

While this invention has been described in terms of certain embodiments thereof, it is not intended that it be limited to the above description but rather only to the extent set forth in the claims that follow. The embodiment of the invention in which an exclusive property is claimed are defined as follows:

1. A method for aligning a mask to a workpiece comprising fabricating a mask having at least two fiducial features spaced apart by a first distance less than a desired distance, mounting said mask in a frame comprising a side that is thermally expandable along an axis, arranging said frame and said workpiece such that the mask overlies the workpiece, and heating the side of said frame to expand the side and thereby to stretch the mask axially to space apart the fiducial features by a second distance equal to the desired distance.

2. A method for aligning a mask to a workpiece, said workpiece having a first fiducial feature and a second fiducial feature spaced apart by a predetermined distance, said method comprising fabricating a polymeric mask having a third fiducial feature adapted for registration with said first fiducial feature and a fourth fiducial feature adapted for registration with said second fiducial feature, said third fiducial feature and said fourth fiducial feature being spaced apart by a first distance less than the predetermined distance, mounting said polymeric mask in a frame comprising four sides disposed in a substantially rectangular arrangement, each said side being thermally isolated from the remaining sides and thermally expandable, arranging said frame and said workpiece such that the polymeric mask overlies the workpiece, heating at least one side of said frame to expand the at least one side to stretch the polymeric mask to space apart the third fiducial feature and the fourth fiducial feature by a second distance corresponding to the predetermined distance, and aligning the polymeric mask and the workpiece to register the first fiducial feature and the third fiducial feature and to register the second fiducial feature and the fourth fiducial feature.

3. A frame for holding a mask comprising a plurality of sides, each said side comprising an inner edge, said sides being arranged such that the inner edges define an opening for positioning a workpiece therein, and means for attaching a mask to said frame such that the mask covers the opening, at least one side including heating means for heating said at least one side independent of the remaining sides to expand said at least one side and thereby stretch said mask attached to the frame.

4. A frame for holding a polymeric mask comprising at least four sides, each said side comprising an inner edge and a surface, said sides being arranged such that the inner edges thereof define a substantially rectangular opening sized and shaped for positioning a workpiece therein and further such that said surfaces of said sides are generally coplanar, each said side comprising opposite ends that are connected to ends of adjacent sides to form corners for the frame, means for attaching a polymeric mask to said surfaces of the sides to thereby attach the polymeric mask to the frame such that the mask overlaps said sides and covers the opening, each said side further comprising heating means for heating said side independent of the remaining sides to expand said side and thereby stretch a polymeric mask attached to the frame.

* * * * *